(12) United States Patent
Kushiyama et al.

(10) Patent No.: US 7,657,798 B2
(45) Date of Patent: Feb. 2, 2010

(54) SEMICONDUCTOR INTEGRATED CIRCUIT AND THE SAME CHECKING METHOD

(75) Inventors: Natsuki Kushiyama, Kawasaki (JP); Shigeaki Iwasa, Kawasaki (JP)

(73) Assignee: Kabushiki Kaisha Toshiba, Tokyo (JP)

(*) Notice: Subject to any disclaimer, the term of this patent is extended or adjusted under 35 U.S.C. 154(b) by 433 days.

(21) Appl. No.: 11/645,509

(22) Filed: Dec. 27, 2006

(65) Prior Publication Data
US 2007/0226552 A1    Sep. 27, 2007

(30) Foreign Application Priority Data
Dec. 28, 2005   (JP)  .............................. 2005-379456

(51) Int. Cl.
*G11C 29/00* (2006.01)
(52) U.S. Cl. .................. 714/710; 714/711; 714/718; 714/723; 714/736; 714/799; 714/807; 714/808; 714/5; 714/6; 714/7; 714/42; 324/763; 365/201
(58) Field of Classification Search ................. None
See application file for complete search history.

(56) References Cited

U.S. PATENT DOCUMENTS

| 2002/0062458 A1* | 5/2002 | Maeno .......................... 714/6 |
| 2002/0125907 A1* | 9/2002 | Kurtulik et al. ............. 324/765 |
| 2005/0076274 A1* | 4/2005 | Nagai et al. ................. 714/718 |

FOREIGN PATENT DOCUMENTS

| JP | 64-23465  | 1/1989 |
| JP | 7-272411  | 10/1995 |

* cited by examiner

*Primary Examiner*—John P Trimmings
(74) *Attorney, Agent, or Firm*—Finnegan, Henderson, Farabow, Garrett & Dunner, L.L.P.

(57) ABSTRACT

A semiconductor integrated circuit has a cell array, a redundancy cell capable of replacing a defective cell, a redundancy control circuit, a plurality of first fuses, a plurality of second fuses, a plurality of third fuses, a first shift register configured to hold states of the plurality of first fuses, a second shift register configured to be connected in cascade to the first shift register and to hold states of the plurality of second fuses, a third shift register configured to be connected to the first and second shift registers in cascade and to hold states of the plurality of third fuses, a CRC remainder calculator configured to sequentially input information held by the first to third shift registers to a CRC generating equation to calculate a remainder obtained by division, and a CRC determination part that outputs information indicative of whether the first to third fuses are correctly programmed.

18 Claims, 5 Drawing Sheets

FIG. 1

FIG. 2 CRC REMAINDER CALCULATION CIRCUIT

CRC REMAINDER CALCULATION CIRCUIT

SEMICONDUCTOR INTEGRATED CIRCUIT AND THE SAME CHECKING METHOD

CROSS REFERENCE TO RELATED APPLICATIONS

This application is based upon and claims the benefit of priority from the prior Japanese Patent Application No. 2005-379456, filed on Dec. 28, 2005, the entire contents of which are incorporated herein by reference.

BACKGROUND OF THE INVENTION

1. Field of the Invention

The present invention relates to a semiconductor integrated circuit capable of replacing a defective memory cell with a redundant cell and a checking method for checking whether replacement with a redundant cell. is correctly performed.

2. Related Art

There are known SRAMs capable of replacing a defective memory cell with a redundant cell to improve yield (see JP-A 7-272411 (Kokai) and JP-A 1-23465 (Kokai)).

In a semiconductor integrated circuit including an SRAM of this type, a so-called die sort test is first performed at the wafer level. If any defective cell is found in the SRAM at the time of the die sort test, it is checked with a tester whether a redundancy control circuit incorporated in the SRAM can relieve the defective cell. If the redundancy control circuit can relieve the defective cell, redundancy information for relieving the defective cell is stored in the tester.

A die sort test is usually performed for each lot, which is composed of a plurality of wafers. Pieces of redundancy information of all chips included in one lot are collectively outputted at the end of a die sort test for the lot. The outputted redundancy information is associated with chip IDs identifying chips and saved in a predetermined file.

After that, a blowing step is performed for each lot. In the blowing step, fuses corresponding to defective cells in chips are blown by laser based on the redundancy information obtained from the die sort test.

Generally, a device which performs the blowing step does not have the function of confirming whether a fuse is correctly programmed (blown). Accordingly, when the blowing step is performed, there is no way of knowing whether fuses are programmed as intended.

After the blowing step, wafers are diced, encapsulated in packages, and sent to a final test step. After a chip is sealed off, it is impossible to know to which lot the chip belongs, where in the sequence of wafers of the lot a wafer having the chip is located, and at which position on the wafer the chip is present, without reading out its chip ID. If a chip ID is correctly read out, the redundancy information of a semiconductor integrated circuit corresponding to the chip ID can be acquired from the above-described file, and a defective cell can be correctly identified.

However, if a read-out chip ID is incorrect, the redundancy information of a different semiconductor integrated circuit is read out from the file, and a semiconductor integrated circuit having a defective cell cannot be identified. Accordingly, the final test step may not be correctly performed or the time until the final test step ends may become longer.

SUMMARY OF THE INVENTION

According to one embodiment of the present invention, a semiconductor integrated circuit, comprising:

a cell array having a plurality of memory cells;

a redundancy cell capable of replacing a defective cell;

a redundancy control circuit configured to perform control for replacing the defective cell with the redundancy cell;

a plurality of first fuses programmed in accordance with identification information for specifying a chip mounting the cell array;

a plurality of second fuses programmed in accordance with the redundancy information for replacing the defective memory cell with the redundancy cell and various setting information of the chip;

a plurality of third fuses programmed in accordance with a CRC (Cyclic Redundancy Check) code generated based on the redundancy information, various setting information of the chip and the identification information;

a first shift register configured to hold states of the plurality of first fuses;

a second shift register configured to be connected in cascade to the first shift register and to hold states of the plurality of second fuses;

a third shift register configured to be connected to the first and second shift registers in cascade and to hold states of the plurality of third fuses;

a CRC remainder calculator configured to sequentially input information held by the first to third shift registers to a CRC generating equation to calculate a remainder obtained by division; and a CRC determination part configured to output information indicative of whether the first to third fuses are correctly programmed.

According to one embodiment of the present invention, a semiconductor integrated circuit, comprising:

a cell array having a plurality of memory cells;

a redundancy cell capable of replacing a defective memory cell;

a redundancy control circuit configured to perform control for replacing the defective memory cell with the redundancy cell;

a plurality of first fuses programmed in accordance with identification information for identifying the cell array;

a plurality of second fuses programmed in accordance with redundancy information for replacing the defective memory cell with the redundancy cell and various setting information of the chip;

a plurality of third fuses programmed in accordance with a CRC (Cyclic Redundancy Check) generated based on the redundancy information, various setting information of the chip and the identification information;

a first shift register configured to hold states of the plurality of first fuses;

a second shift register configured to be connected in cascade to the first shift register and to hold states of the plurality of second fuses;

a third shift register configured to be connected in cascade to the first and second shift registers and to hold states of the plurality of third fuses;

a CRC remainder calculator configured to sequentially input information held by the first and the second shift registers to calculate a remainder obtained by division; and a CRC determination part configured to output information indicative of whether or not the first to third fuses are correctly programmed based on the remainder and the information held by the third shift register.

DETAILED DESCRIPTION OF THE INVENTION

Embodiments of the present invention will be explained below with reference to the drawings.

First Embodiment

Figure 1:
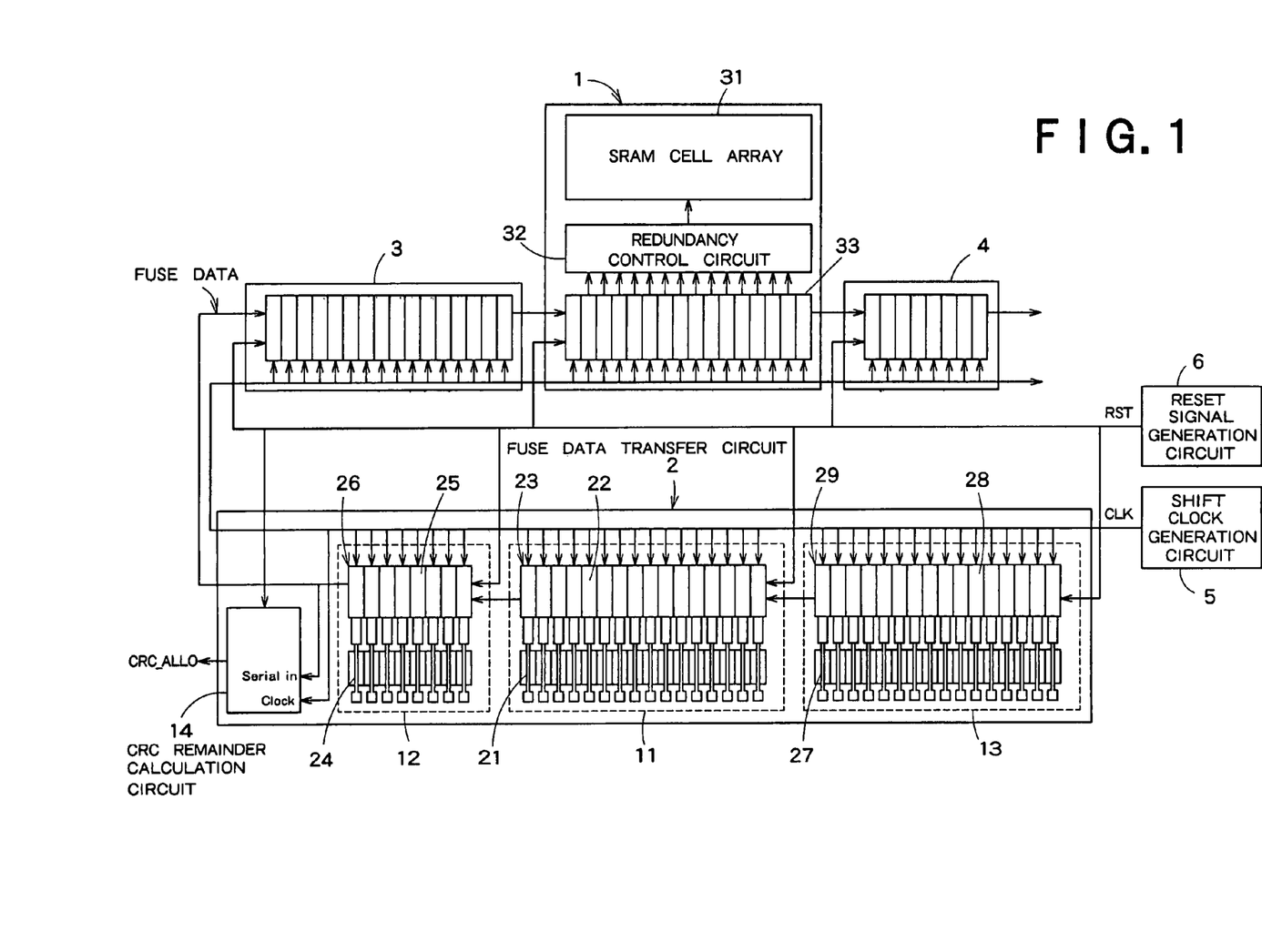
FIG. 1 is a block diagram showing the schematic configuration of a semiconductor integrated circuit according to a first embodiment of the present invention.

FIG. 1 is a block diagram showing the schematic diagram of a semiconductor integrated circuit according to a first embodiment of the present invention. The configuration of the semiconductor integrated circuit shown in FIG. 1 is the configuration of one chip. A plurality of chips shown in FIG. 1 are formed in a wafer.

The chip in FIG. 1 includes an SRAM 1 which is capable of replacing a defective cell with a redundant cell, a fuse data transfer circuit 2 which outputs information on the programming (blowing) of a plurality of fuses in the chip, shift registers 3 and 4, a shift clock generation circuit 5, and a reset signal generation circuit 6.

The fuse data transfer circuit 2 has a redundancy information storage part 11 which stores redundancy information for replacing a defective cell with a redundancy cell and information on various settings for the chip, a chip ID storage part 12 which stores a chip ID identifying the chip, a CRC code storage part 13 which stores a CRC (Cyclic Redundancy Check) code corresponding to the redundancy information and chip ID, and a CRC remainder calculation circuit 14. The CRC remainder calculation circuit 14 inputs the chip ID, redundancy information, and CRC code serially in order into a CRC generating equation and outputs the remainder left over after division.

For example, the information on the various settings for the chip includes the pieces of information (1) to (3) below.

(1) Information on Switching between SSTL, LVCMOS, and HSTL in I/O

Some I/O buffers can support a plurality of voltage levels for SSTL, LVCMOS, HSTL, and the like according to a control signal. This information allows individual or collective switching of the voltage levels of I/O buffers.

(2) Information for Switching Multiplication Number of Internal Clock

This Information defines how many times the frequency of an internal clock is larger than that of an external reference clock.

(3) Information for Switching Frequency of Reference Clock

This information is programmed in advance with which reference clock the chip is used when internal PLL characteristics are changed according to a reference clock frequency given from outside.

(4) Voltage ID

In some cases, the optimum power supply voltage range differs among chips. The optimum power supply voltage range of the chip is preprogrammed into fuses. When using the chip, the information is read out from outside, and an optimum power supply voltage is supplied.

The redundancy information storage part 11 has a plurality of fuses (second fuses) 21 which can be individually programmed according to the redundancy information and the information on the various settings for the chip and a plurality of registers 22 provided corresponding to the fuses to hold the pieces of programming information of the fuses, i.e., the redundancy information. The plurality of registers 22 are cascaded to constitute a shift register (second shift register) 23.

The chip ID storage part 12 has a plurality of fuses (first fuses) 24 which can be individually programmed according to the chip ID and a plurality of registers 25 provided corresponding to the fuses to hold the pieces of programming information of the fuses, i.e., the chip ID. The plurality of registers are cascaded to constitute a shift register (first shift register) 26.

To be more precise, a chip ID refers to a lot number, wafer number, chip coordinates in the wafer, and the like for uniquely identifying the chip.

The CRC code storage part 13 has a plurality of fuses 27 which can be individually programmed according to the CRC code and a plurality of registers 28 provided corresponding to the fuses to hold the pieces of programming information of the fuses, i.e., the CRC code. The plurality of registers 28 are cascaded to constitute a shift register (third register) 29.

The SRAM 1 incorporates an SRAM cell array 31 which is composed of a plurality of SRAM cells, a redundancy control circuit 32 which controls replacement of a defective cell with a redundant cell, and a shift register (fifth shift register) 33 which holds redundancy information output from the fuse data transfer circuit 2. The redundancy control circuit 32 performs the process of replacing a defective cell with a redundant cell based on the redundancy information held in the shift register 33. More specifically, if an address is given from outside, and a memory cell corresponding to the address is a defective cell, the redundancy control circuit 32 accesses a corresponding redundant cell.

The shift register (fourth shift register) 4 holds a chip ID output from the fuse data transfer circuit 2. The shift register (sixth shift register) 3 holds a CRC code output from the fuse data transfer circuit 2.

The three shift registers 26, 23, and 29 in the fuse data transfer circuit 2, the shift register 3, the shift register 33 in the SRAM 1, and the shift register 4 are cascaded and perform shift operations in accordance with a common shift clock CLK.

The shift clock generation circuit 5 generates the shift clock CLK with a duration corresponding to cycles, the number of which is equal to the total number of registers of the three shift registers 26, 23, and 29 in the fuse data transfer circuit 2. For example, if the number of register stages in the shift register 26 is 8, that in the shift register 23 is 16, and that in the shift register 29 is 16, the shift clock CLK with a duration corresponding to 40 (=8+16+16) cycles is output.

When the shift clock CLK with a duration corresponding to 40 cycles is input to the six cascaded shift registers 26, 23, 29, 3, 33, and 4, information held in the three shift registers 26, 23, and 29 in the fuse data transfer circuit 2 is transferred to the other three shift registers 3, 33, and 4. More specifically, a chip ID held in the shift register 26 is transferred to the shift register 4, redundancy information held in the shift register 23 is transferred to the shift register 33, and a CRC code held in the shift register 29 is transferred to the shift register 3.

Data output from the shift register 26 in sync with the shift clock CLK is input not only to the shift register 3 but also to the CRC remainder calculation circuit 14. The CRC remainder calculation circuit 14 divides serially input 40-bit data (8 bits of chip ID+16 bits of redundancy information+16 bits of CRC code) by a CRC generating polynomial ($x^{16}+x^{12}+x^5+1$) to calculate the remainder. If there is no error in the input 40 bits, the remainder becomes 0.

Figure 2:
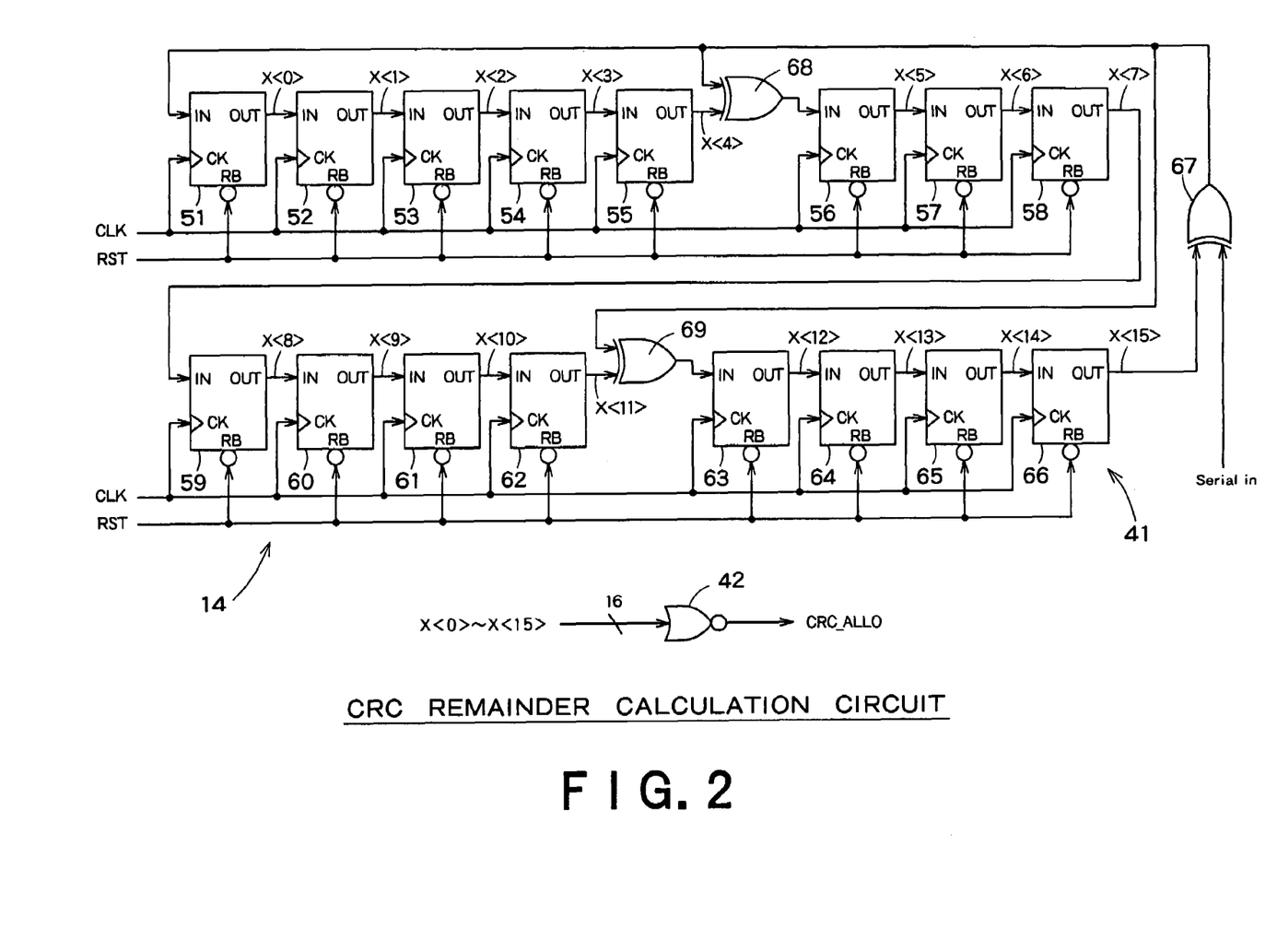
FIG. 2 is a block diagram showing an example of the internal configuration of a CRC remainder calculation circuit 14.

FIG. 2 is a block diagram showing an example of the internal configuration of the CRC remainder calculation circuit 14. The CRC remainder calculation circuit 14 in FIG. 2 has a CRC remainder calculation part 41 which inputs data held in the shift registers 26, 23, and 29 into the CRC generating equation and calculates the remainder left over after division and a CRC determination part 42 which determines based on the calculated remainder whether the fuses 22, 25, and 38 are correctly programmed.

The CRC remainder calculation part 41 has flip-flops 51 to 66 constituting a divider for the CRC generating polynomial (equation) and EXOR gates 67 to 69. The CRC determination part 42 has a NOR gate 42 which performs a NOR operation on outputs from the flip-flops 51 to 66.

Any of the flip-flops 51 to 66 operates in sync with the common shift clock CLK. The flip-flops 51 to 55 are cascaded, and an output from the flip-flop 55 at the last stage is input to the flip-flop 56 via the EXOR gate 68. The flip-flops 56 to 62 are cascaded, and an output from the flip-flop 62 at the last stage is input to the flip-flop 63 via the EXOR gate 69. The flip-flops 63 to 66 are cascaded, and an output from the flip-flop 66 at the last stage is input to the flip-flop 51 via the EXOR gate 67.

The EXOR gate 67 carries out an exclusive OR between data input to the CRC remainder calculation circuit 14, i.e., an output from the chip ID storage part 12 and an output from the flip-flop 66. The EXOR gate 68 carries out-an exclusive OR between an output from the EXOR gate 67 and an output from the flip-flop 55. The EXOR gate 69 carries out an exclusive OR between outputs from the flip-flops 58 and 62.

Data of 40 bits composed of a chip ID, redundancy information, and a CRC code supplied from the fuse data transfer circuit 2 is input to the CRC remainder calculation circuit 14, and the remainder left over after dividing the 40-bit data by the CRC generating polynomial is output from the flip-flops 51 to 66. Outputs from the flip-flops 51 to 66, all of which have a value of 0, indicate that there is no error in the input 40 bits. On the other hand, outputs from the flip-flops, any of which has a value of not 0, indicate that there is an error in the input 40 bits.

If outputs from the flip-flops 51 to 66 are all 0, an output from the CRC determination part 42 becomes 1. If an output from at least one of the flip-flops becomes 1, an output from the CRC determination part 42 becomes 0. Accordingly, it can be detected from an output of the CRC determination part 42 whether there is any error in input 40 bits.

Figure 3:
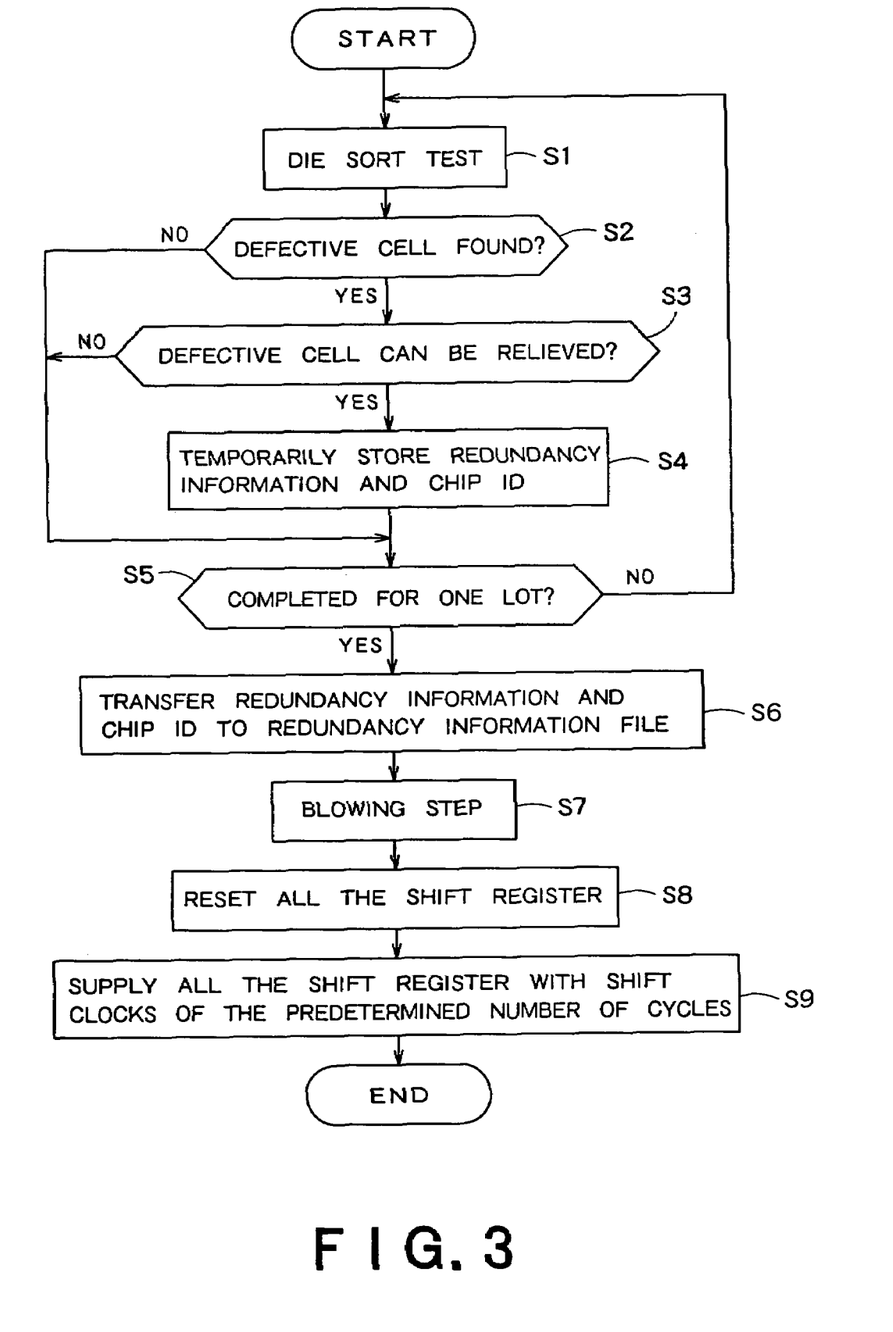
FIG. 3 is a flowchart showing the procedure for a chip checking method according to this embodiment.

FIG. 3 is a flowchart showing the procedure for a chip checking method according to this embodiment. The processing in the flowchart is performed using a checking device (not shown) such as a tester. The chip checking method will be explained below in order with reference to the flowchart. The processing below is performed for each lot, which is composed of a plurality of wafers.

When semiconductor integrated circuits for each lot are formed on wafers as shown in FIG. 1, a test for the SRAMs 1, i.e., a so-called die sort test is performed (step S1). At the time of the die sort test, not only the test for the SRAMs 1 in the semiconductor integrated circuits but also a test for logic parts, each of which is a part other than the corresponding SRAM 1, is performed.

It is then determined whether there is found any defective cell in the SRAMs 1 at the time of the die sort test (step S2). If there is found any defective cell, it is determined whether the corresponding redundancy control circuit 32 can relieve the defective cell (step S3). The determination is performed by a test program of the tester.

If the redundancy control circuit 32 can relieve the defective cell, a piece of redundancy information for replacing the defective cell with a redundant cell and a chip ID indicating to which lot the defective cell belongs, where in the sequence of wafers of the lot a wafer having the defective cell is located, and at which position on the wafer the defective cell is present are stored in a temporary storage part in the checking device (step S4).

When the processing in step S4 ends or the determination in step S2 or S3 is negative, it is determined whether all of the wafers for one lot have undergone the die sort test (step S5). If there are wafers not having undergone the die sort test, the processes in steps S1 to S4 are performed for each of the remaining wafers.

If the wafers for one lot have undergone the die sort test, chip IDs and pieces of redundancy information for the lot stored in the temporary storage part are all transferred to a redundancy information file in the checking device (step S6).

A blowing step is performed based on the redundancy information file with respect to the wafers for one lot having undergone the die sort test (step S7). In the blowing step, the fuses in the redundancy information storage parts 11 are blown by laser according to the redundancy information described in the redundancy information file. In parallel with this, the fuses in the chip ID storage parts 12 are blown by laser according to the chip IDs of chips having defective cells. The fuses in the CRC code storage parts 13 are blown by laser according to CRC codes generated from the redundancy information and chip IDs. Each fuse is connected to a corresponding data input terminal. The logic of the data input terminal becomes 0 or 1 depending on whether the fuse is programmed (blown).

The reset signal generation circuit 6 outputs a reset signal to reset outputs from all of the shift registers to 0 (step S8).

After that, the shift clock generation circuit 5 outputs the shift clock CLK (step S9). With this clock, the shift registers 26, 23, and 29 in the fuse data transfer circuit 2 latch the programming information (whether the fuses are conducting or blown) which are supplied to the data input terminals. That is, the shift registers 26, 23, and 29 hold a chip ID, redundancy information, and a CRC code. Since the shift clock CLK with a duration corresponding to 40 cycles (8 bits of chip ID+16 bits of redundancy information+16 bits of CRC code) is output, the information latched by the shift registers 26, 23, and 29 are serially shifted.

With this operation, the chip ID, redundancy information, and CRC code held in the shift registers 26, 23, and 29 in the fuse data transfer circuit 2 are respectively transferred to the shift registers 4, 33, and 3. In parallel with this, the CRC remainder calculation circuit 14 outputs a signal indicating whether there is any error in the chip ID, redundancy information, and CRC code held in the shift registers 26, 23, and 29. It can be detected from the logic of the output whether the fuses 21, 24, and 27 in the fuse data transfer circuit 2 can be correctly programmed.

As described above, in the first embodiment, since the CRC code storage part 13, which stores CRC code information generated based on a chip ID and redundancy information, and the CRC remainder calculation circuit 14, which detects whether there is any error in the chip ID, redundancy information, and CRC code information, are provided, it is possible to easily and correctly detect whether a desired fuse is correctly programmed. Accordingly, the final test after manufacturing a semiconductor integrated circuit can be performed in a short time and with high accuracy, and the productivity can be improved.

Second Embodiment

Figure 4:
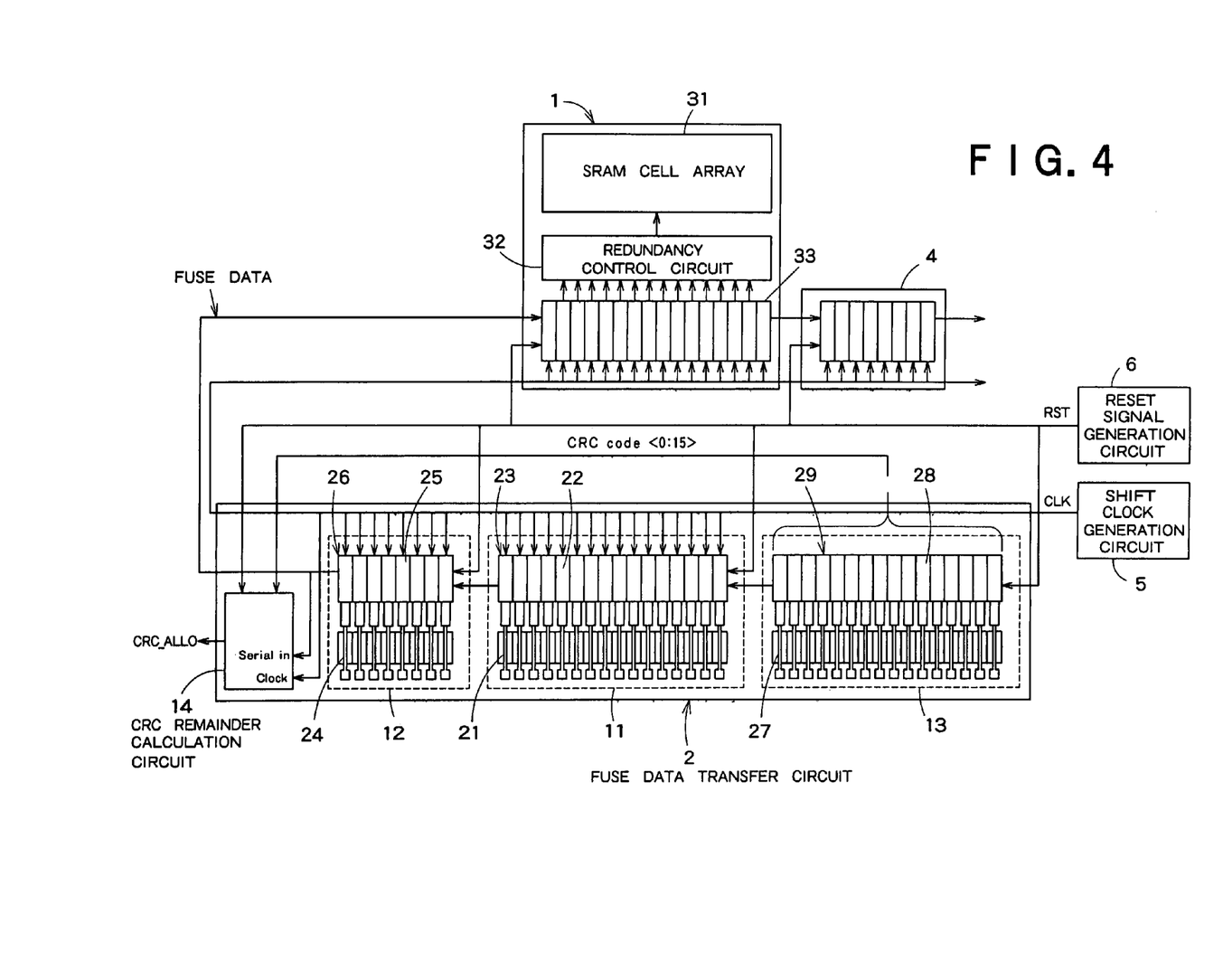
FIG. 4 is a block diagram showing the schematic configuration of a semiconductor integrated circuit according to a second embodiment of the present invention.

In a second embodiment, a shift register which holds a CRC code transferred from a shift register in a CRC code storage part 13 is omitted.

FIG. 4 is a block diagram showing the schematic configuration of a semiconductor integrated circuit according to the second embodiment of the present invention. The same components in FIG. 4 as those in FIG. 1 are denoted by the same reference numerals, and an explanation will be given below with a focus on differences.

The semiconductor integrated circuit in FIG. 4 is different from that in FIG. 1 in that it does not include the shift register 3 in FIG. 1 and that it includes a CRC remainder calculation circuit 14 having a circuit configuration different from that of the CRC remainder calculation circuit 14 in FIG. 1. Additionally, a shift register 29 in a fuse data transfer circuit 2 which holds a CRC code is not cascaded to other shift registers 23, 26, 3, 33, and 4 and does not perform a shift operation.

In the semiconductor integrated circuit in FIG. 1, the shift clock CLK with a duration corresponding to 40 cycles is supplied to the six shift registers 4, 33, 3, 26, 23, and 29, and data held in the three shift registers 26, 23, and 29 in the fuse data transfer circuit 2 are all transferred to the shift registers 4, 33, and 3. In contrast, in the semiconductor integrated circuit in FIG. 4, a shift clock CLK with a duration corresponding to 24 cycles (=8+16) is supplied to the five shift registers 4, 33, 26, 23, and 29, and data held in the two shift registers 26 and 23 in the fuse data transfer circuit 2 are transferred to the shift registers 4 and 33. A CRC code held in the shift register 29 is not shifted and remains in the shift register 29.

Figure 5:
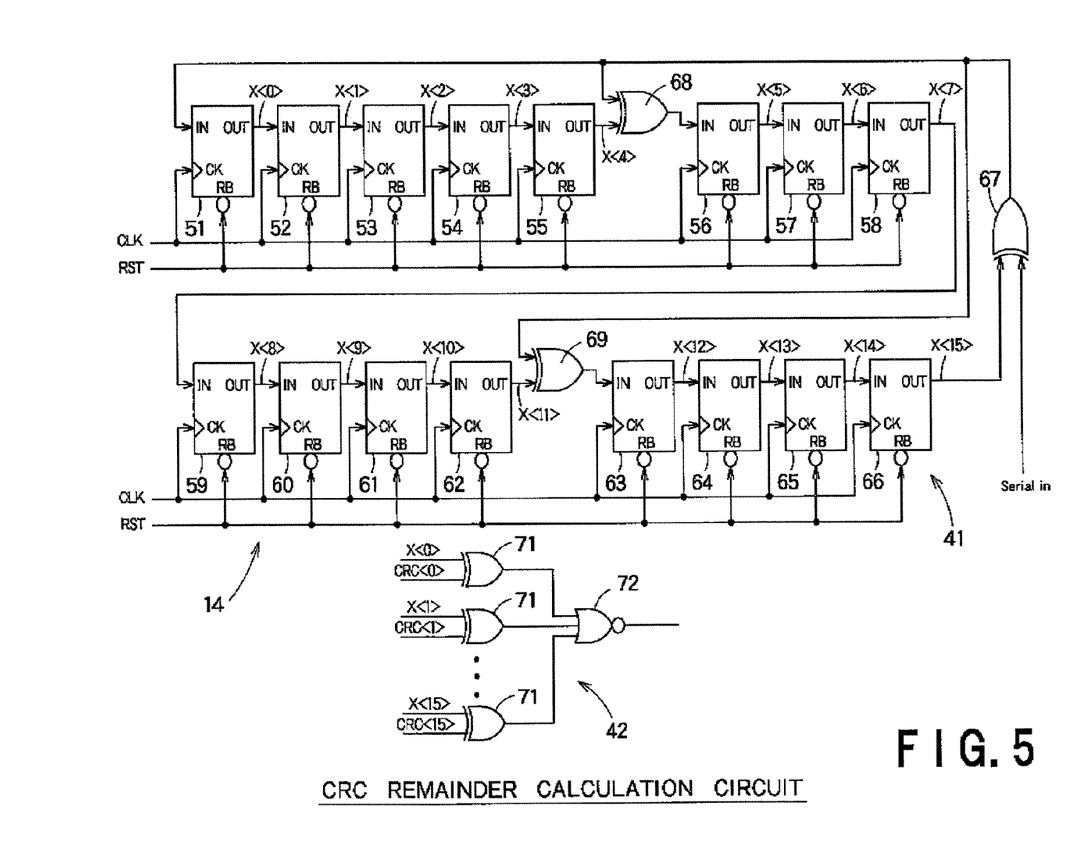
FIG. 5 is a circuit diagram showing the internal configuration of a CRC remainder calculation circuit 14 in FIG. 4.

FIG. 5 is a circuit diagram showing the internal configuration of the CRC remainder calculation circuit 14 in FIG. 4. In FIG. 5, the circuit configuration of a CRC remainder calculation part 41 which is configured to use the CRC generating polynomial is the same as that in FIG. 2. The CRC remainder calculation part 41 has flip-flops 51 to 66 and EXOR gates 67 to 69. The circuit configuration of a CRC determination part 42 which generates an error determining signal based on outputs from the flip-flops 51 to 66 is different from that of the CRC determination part 42 in FIG. 2. The CRC determination part 42 in FIG. 5 has 16 EXOR gates 71, each of which compares a corresponding one of outputs X<0> to X<15> from the flip-flops 51 to 66 with a corresponding one of outputs CRC<0> to CRC<15> (CRC code) from the shift register 29 in the fuse data transfer circuit 2 to see whether they coincide with each other, and a NOR gate 72 which carries out a negative OR between outputs from the EXOR gates 71.

Since a chip ID and redundancy information held in the shift registers 26 and 23 in the fuse data transfer circuit 2 are all transferred to the CRC remainder calculation circuit 14, the CRC determination part 42 in the CRC remainder calculation circuit 14 is supposed to generate a CRC code. Accordingly, if there is no error in the chip ID and redundancy information transferred from the fuse data transfer circuit 2, the outputs X<0> to X<15> from the flip-flops 51 to 66 become equal to the CRC code held in the shift register 29 in the fuse data transfer circuit 2. In this case, outputs from the 16 EXOR gates 71 become all 0, and an output from the NOR gate becomes 1.

On the other hand, if there is an error in any one bit of the chip ID and redundancy information transferred from the fuse data transfer circuit 2, the outputs from the flip-flops 51 to 66 do not completely coincide with the CRC code held in the shift register 29 in the fuse data transfer circuit 2. An output from any of the EXOR gates 71 becomes 1, and the output from the NOR gate 72 becomes 0.

As described above, in the second embodiment, the CRC determination part 42 in the CRC remainder calculation circuit 14 performs a comparison with a CRC code held in the fuse data transfer circuit 2. Therefore, it is possible to decrease the number of the shift register 29 by one, compared with the first embodiment, and also to decrease the number of the necessary shift clock. Accordingly, the size of the circuit configuration can be reduced, and the test time can be shortened.

Each of the above-described embodiments has explained an example where redundancy processing of SRAM cells is performed. The present invention, however, can also be applied to various types of memory cells (e.g., a flash memory, EPROM, and DRAM).

In FIGS. 1 and 4, the shift register 26, which holds a chip ID, is connected on the subsequent stage of the shift register 23, which holds redundancy information. The connection order may be changed.

Each of the embodiments has explained an example where a fuse is blown by laser. However, in the present invention, not only a laser blow fuse which is blown by laser but also various types of fuses can be used. For example, a polysilicon fuse is melted instead of being blown. There is also available a fuse in which a high voltage applied to an insulating film breaks down the insulating film to cause a short circuit. In this specification, programming means applying external physical force to a fuse of any type to change the initial state of the fuse to another state.

What is claimed is:

1. A semiconductor integrated circuit, comprising:
   a cell array having a plurality of memory cells;
   a redundancy control circuit configured to perform control for replacing a defective memory cell with a redundancy cell;
   a plurality of first fuses programmed in accordance with identification information for specifying a chip mounting the cell array;
   a plurality of second fuses programmed in accordance with redundancy information for replacing the defective memory cell with the redundancy cell and various setting information of the chip;
   a plurality of third fuses programmed in accordance with a CRC (Cyclic Redundancy Check) code generated based on the redundancy information, various setting information of the chip and the identification information;
   a first shift register configured to hold states of the plurality of first fuses;
   a second shift register configured to be connected in cascade to the first shift register and to hold states of the plurality of second fuses;
   a third shift register configured to be connected to the first and second shift registers in cascade and to hold states of the plurality of third fuses;
   a CRC remainder calculator configured to sequentially input information held by the first to third shift registers to a CRC generating equation to calculate a remainder obtained by division; and
   a CRC determination part configured to output information indicative of whether the first to third fuses are correctly programmed.

2. The semiconductor integrated circuit according to claim 1, further comprising:

a fourth shift register configured to store information held by the first shift register;

a fifth shift register configure to be connected in cascade to the fourth shift register and to store information held by the second shift register; and a sixth shift register configured to be connected in cascade to the fourth and fifth shift registers and to store information held by the third shift register, wherein the redundancy control circuit performs control for replacing the defective memory cell with the redundancy cell based on the information stored in the fifth shift register.

3. The semiconductor integrated circuit according to claim 2, further comprising:

a clock supply circuit configured to supply the first to sixth shift registers with shift clocks of cycles equal to the total number of the registers that the first to third shift registers have.

4. The semiconductor integrated circuit according to claim 3, further comprising:

a reset circuit configured to reset the outputs of the first to sixth shift registers to zero at a time of power-on or external reset.

5. The semiconductor integrated circuit according to claim 4, wherein the first to third shift registers have data input terminals configured to input states of the respective first to third fuses; and the first to third shift registers hold data inputted to the respective data input terminals with the shift clock firstly inputted after reset.

6. The semiconductor integrated circuit according to claim 1, wherein the CRC remainder calculator has a plurality of flipflops and a plurality of gate circuits connected in a ring shape; and the CRC determination part detects whether outputs of the plurality of flipflops are zero, and outputs information indicative of whether the first to third fuses are correctly programmed.

7. The semiconductor integrated circuit according to claim 1, wherein various setting information of the chip includes at least one of voltage setting information of an I/O buffer in the chip, information for switching multiples of an internal clock in the chip, frequency information of a reference clock supplied from outside and power supply voltage information of the chip.

8. A semiconductor integrated circuit, comprising:

a cell array having a plurality of memory cells;

a redundancy control circuit configured to perform control for replacing a defective memory cell with a redundancy cell;

a plurality of first fuses programmed in accordance with identification information for identifying the cell array;

a plurality of second fuses programmed in accordance with redundancy information for replacing the defective memory cell with the redundancy cell and various setting information of the chip;

a plurality of third fuses programmed in accordance with a CRC (Cyclic Redundancy Check) code generated based on the redundancy information, various setting information of the chip and the identification information;

a first shift register configured to hold states of the plurality of first fuses;

a second shift register configured to be connected in cascade to the first shift register and to hold states of the plurality of second fuses;

a third shift register configured to be connected in cascade to the first and second shift registers and to hold states of the plurality of third fuses;

a CRC remainder calculator configured to sequentially input information held by the first and the second shift registers to calculate a remainder obtained by division; and a CRC determination part configured to output information indicative of whether or not the first to third fuses are correctly programmed based on the remainder and the information held by the third shift register.

9. The semiconductor integrated circuit according to claim 8, further comprising:

a fourth shift register configured to store information held by the first shift register; and a fifth shift register configured to be connected in cascade to the fourth shift register and to store information held by the second shift register, wherein the redundancy control circuit performs control for replacing the defective memory cell with the redundancy cell based on information stored in the fifth shift register.

10. The semiconductor integrated circuit according to claim 9, further comprising:

a clock supply circuit configured to supply the first, second, fourth and fifth shift registers with shift clocks of cycles equal to the total number of the registers that the first and second shift registers have.

11. The semiconductor integrated circuit according to claim 9, further comprising:

a reset circuit configured to reset the outputs of the first, second, fourth and fifth shift registers to zero at a time of power-on or external reset.

12. The semiconductor integrated circuit according to claim 11, wherein the first and second shift registers have data input terminals configured to input states of the respective first and second fuses, and hold data inputted to the respective data input terminals with a shift clock firstly inputted after reset.

13. The semiconductor integrated circuit according to claim 8, wherein the CRC remainder calculator has a plurality of flipflops and a plurality of gate circuits connected in a ring shape; and the CRC determination part detects whether the outputs of the plurality of flipflops coincide with information held by the third shift register, and outputs information indicative of whether the first to third fuses are correctly programmed.

14. The semiconductor integrated circuit according to claim 8, wherein various setting information of the chip includes at least one of voltage setting information of an I/O buffer in the chip, information for switching multiples of an internal clock in the chip, frequency information of a reference clock supplied from outside and power supply voltage information of the chip.

15. A checking method of a semiconductor integrated circuit, comprising:

holding states of a plurality of first fuses to a first shift register, the plurality of first fuses being programmed in accordance with identification information for identifying a cell array, the cell array having a plurality of memory cells;

holding states of a plurality of second fuses to a second shift register connected in cascade to the first shift register, the plurality of second fuses being programmed in accordance with redundancy information for replacing a defective memory cell with a redundancy cell;

holding states of a plurality of third fuses to a third shift register connected in cascade to the first and second shift registers, the plurality of third fuses being programmed in accordance with a CRC (Cyclic Redundancy Check) code generated based on the redundancy information, various setting information of the chip and identification information;

sequentially inputting the information held by the first to third shift registers to a CRC generating polynomial to calculate a remainder obtained by division, or sequentially inputting the information held by the first and second shift registers to the CRC generating polynomial to calculate a remainder obtained by division; and outputting information indicative of whether the first to third fuses are correctly programmed based on the remainder.

16. The checking method according to claim 15, further comprising:

storing the information held by the first shift register in a fourth shift register; and storing the information held by the second shift register in a fifth shift register connected in cascade to the forth shift register, wherein the redundancy control circuit performs control for replacing the defective cell with the redundancy cell based on the information stored in the fifth shift register.

17. The checking method according to claim 15, wherein the outputs of the first, second, fourth and fifth shift registers are reset to zero at a time of power-on or external reset.

18. The checking method according to claim 15, wherein various setting information of the chip includes at least one of voltage setting information of an I/O buffer in the chip, information for switching multiples of an internal clock in the chip, frequency information of a reference clock supplied from outside and power supply voltage information of the chip.

* * * * *